United States Patent
Kikama et al.

(10) Patent No.: US 10,968,515 B2
(45) Date of Patent: Apr. 6, 2021

(54) VERTICAL HEAT TREATMENT APPARATUS

(71) Applicant: TOKYO ELECTRON LIMITED, Tokyo (JP)

(72) Inventors: Eiji Kikama, Nirasaki (JP); Hiromi Shima, Nirasaki (JP); Kyungseok Ko, Gyeonggi-do (KR); Shingo Hishiya, Nirasaki (JP); Keisuke Suzuki, Nirasaki (JP); Tosihiko Jo, Nirasaki (JP); Ken Itabashi, Nirasaki (JP); Satoru Ogawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 114 days.

(21) Appl. No.: 16/223,327

(22) Filed: Dec. 18, 2018

(65) Prior Publication Data
US 2019/0186014 A1 Jun. 20, 2019

(30) Foreign Application Priority Data
Dec. 20, 2017 (JP) .............................. JP2017-244120

(51) Int. Cl.
| C23C 16/46 | (2006.01) |
| H01L 21/673 | (2006.01) |
| H01L 21/02 | (2006.01) |
| C23C 16/458 | (2006.01) |
| C23C 16/455 | (2006.01) |
| C23C 16/34 | (2006.01) |
| H01L 21/67 | (2006.01) |

(52) U.S. Cl.
CPC ............ *C23C 16/46* (2013.01); *C23C 16/345* (2013.01); *C23C 16/4583* (2013.01); *C23C 16/45544* (2013.01); *C23C 16/45553* (2013.01); *C23C 16/45578* (2013.01); *H01L 21/02126* (2013.01); *H01L 21/6732* (2013.01); *H01L 21/67109* (2013.01); *H01L 21/0217* (2013.01); *H01L 21/0228* (2013.01); *H01L 21/02211* (2013.01)

(58) Field of Classification Search
USPC .......................................................... 118/725
See application file for complete search history.

(56) References Cited

U.S. PATENT DOCUMENTS

2005/0098107 A1* 5/2005 Du Bois ........... H01L 21/67757
118/715

FOREIGN PATENT DOCUMENTS

JP 201463959 A 4/2014

* cited by examiner

*Primary Examiner* — Ram N Kackar
(74) *Attorney, Agent, or Firm* — Nath, Goldberg & Meyer; Jerald L. Meyer

(57) ABSTRACT

There is provided a vertical heat treatment apparatus for forming a film by supplying a precursor gas to a plurality of substrates that are held in a substantially horizontal posture on a substrate holder with a predetermined interval in a vertical direction. The apparatus includes a processing container including an inner tube accommodating the substrate holder and an outer tube that is disposed outside the inner tube; and a gas nozzle that extends vertically along an inner peripheral surface of the inner tube and has a distal end that penetrates from an inside of the inner tube to an outside of the inner tube. A first gas hole for supplying the precursor gas to the inside of the inner tube and a second gas hole for supplying the precursor gas to the outside of the inner tube are formed on the gas nozzle.

8 Claims, 13 Drawing Sheets

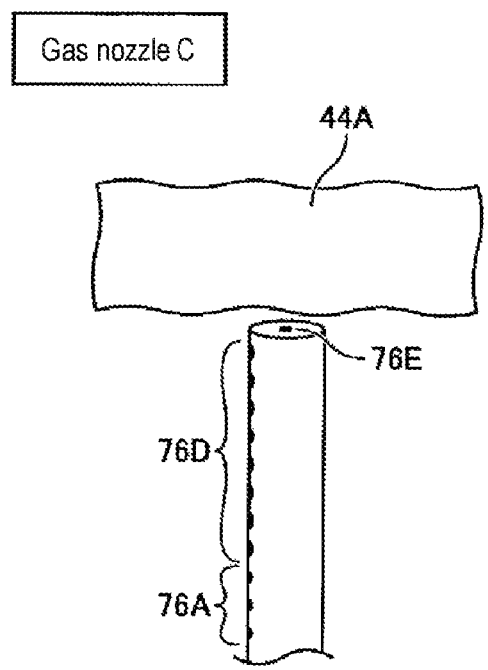

FIG. 11

| | The inside of inner tube 44 | | | The outside of inner tube 44 | Simulation | |
|---|---|---|---|---|---|---|
| | 76A for product processing | For depressurization | | | Amount of products inside gas nozzle (when film of 3μm was formed on wafer) | |
| | | Nozzle upper side 76D | Nozzle ceiling plate 76E | Nozzle upper side 76B | Maximum value | Position |
| Gas nozzle A | Hole of the same size × number | — | — | Large hole × 8 | 6.3μm | Nozzle upper side/ outside inner tube 44 |
| Gas nozzle B | Hole of the same size × number | — | — | — | 72μm | Nozzle upper side/ inside inner tube 44 |
| Gas nozzle C | Hole of the same size × number | Large hole × 8 | Large hole × 1 | — | 9.3μm | Nozzle upper side/ inside inner tube 44 |

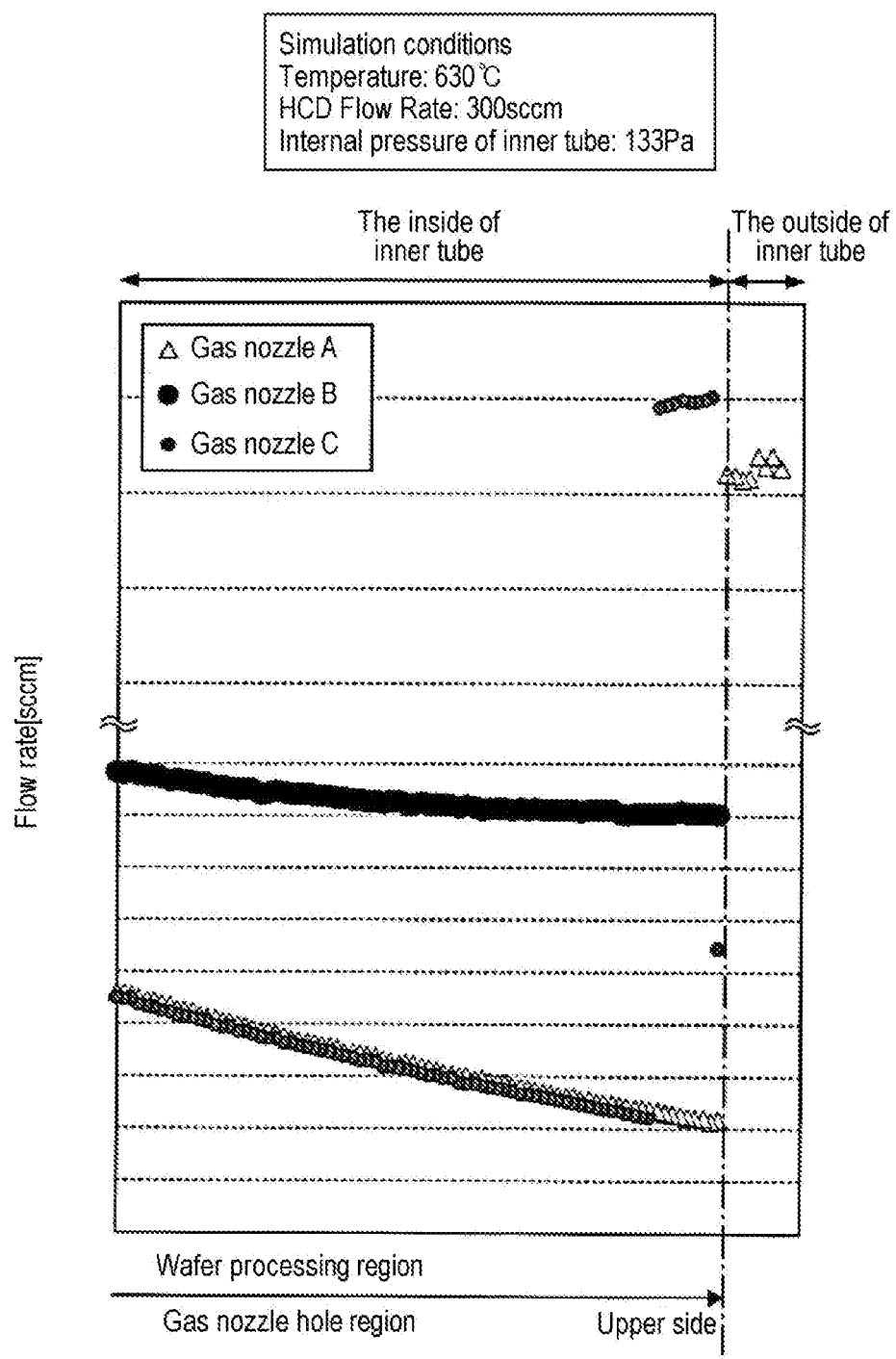

VERTICAL HEAT TREATMENT APPARATUS

CROSS-REFERENCE TO RELATED APPLICATION

This application is based upon and claims the benefit of priority from Japanese Patent Application No. 2017-244120, filed on Dec. 20, 2017, the entire contents of which are incorporated herein by reference.

TECHNICAL FIELD

The present disclosure relates to a vertical heat treatment apparatus.

BACKGROUND

In the manufacture of semiconductor devices, various processing apparatuses are used for processing substrates. As one of the processing apparatuses, a batch type vertical heat treatment apparatus capable of heat-treating a plurality of substrates at a time is known. In the vertical heat treatment apparatus, for example, a film is formed on the surface of a substrate by supplying a precursor gas toward the substrate in a horizontal direction from a gas nozzle that extends vertically along the inner peripheral surface of a processing container accommodating the substrate.

In the vertical heat treatment apparatus, when the temperature of the heat treatment is higher than the thermal decomposition temperature of the precursor gas, the precursor gas may be thermally decomposed in the gas nozzle and decomposed matter may be adhered to the inner wall of the gas nozzle. When the amount of decomposed matter adhered to the inner wall of the gas nozzle increases, the decomposed matter is peeled off from the inner wall of the gas nozzle during the heat treatment, which causes particles.

As an apparatus for reducing the amount of decomposed matter adhered to the inner wall of the gas nozzle, an apparatus including a gas nozzle, in which the opening area of a gas hole in a region facing a dummy substrate region is set to be larger than the opening area of a gas hole in a region corresponding to a product substrate region, is known.

However, in the above-described apparatus, since the opening area of the gas hole in the region corresponding to the product substrate region is different from the opening area of the gas hole in the region corresponding to the dummy substrate region, the flow of the precursor gas in the product substrate region that is close to the dummy substrate region is likely to be biased, which may result in poor inter-plane uniformity.

SUMMARY

Some embodiments of the present disclosure provide a vertical heat treatment apparatus capable of reducing an amount of decomposed matter adhered to an inner wall of a gas nozzle while reducing the bias of a gas flow in a substrate processing region.

According to one embodiment of the present disclosure, there is provided a vertical heat treatment apparatus for forming a film by supplying a precursor gas to a plurality of substrates that are held in a substantially horizontal posture on a substrate holder with a predetermined interval in a vertical direction, the apparatus comprising: a processing container including an inner tube accommodating the substrate holder and an outer tube that is disposed outside the inner tube; and a gas nozzle that extends vertically along an inner peripheral surface of the inner tube and has a distal end that penetrates from an inside of the inner tube to an outside of the inner tube, wherein a first gas hole for supplying the precursor gas to the inside of the inner tube and a second gas hole for supplying the precursor gas to the outside of the inner tube are formed on the gas nozzle.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9C is a figure for explaining another type of the gas nozzle used in the Examples.

FIG. 11 is a figure that shows a result of simulation on decomposed matter adhered to the inner walls of gas nozzles.

FIG. 12 is a figure that shows a result of simulation on the relationship between a gas hole position and a gas flow velocity.

DETAILED DESCRIPTION

Figure 1:
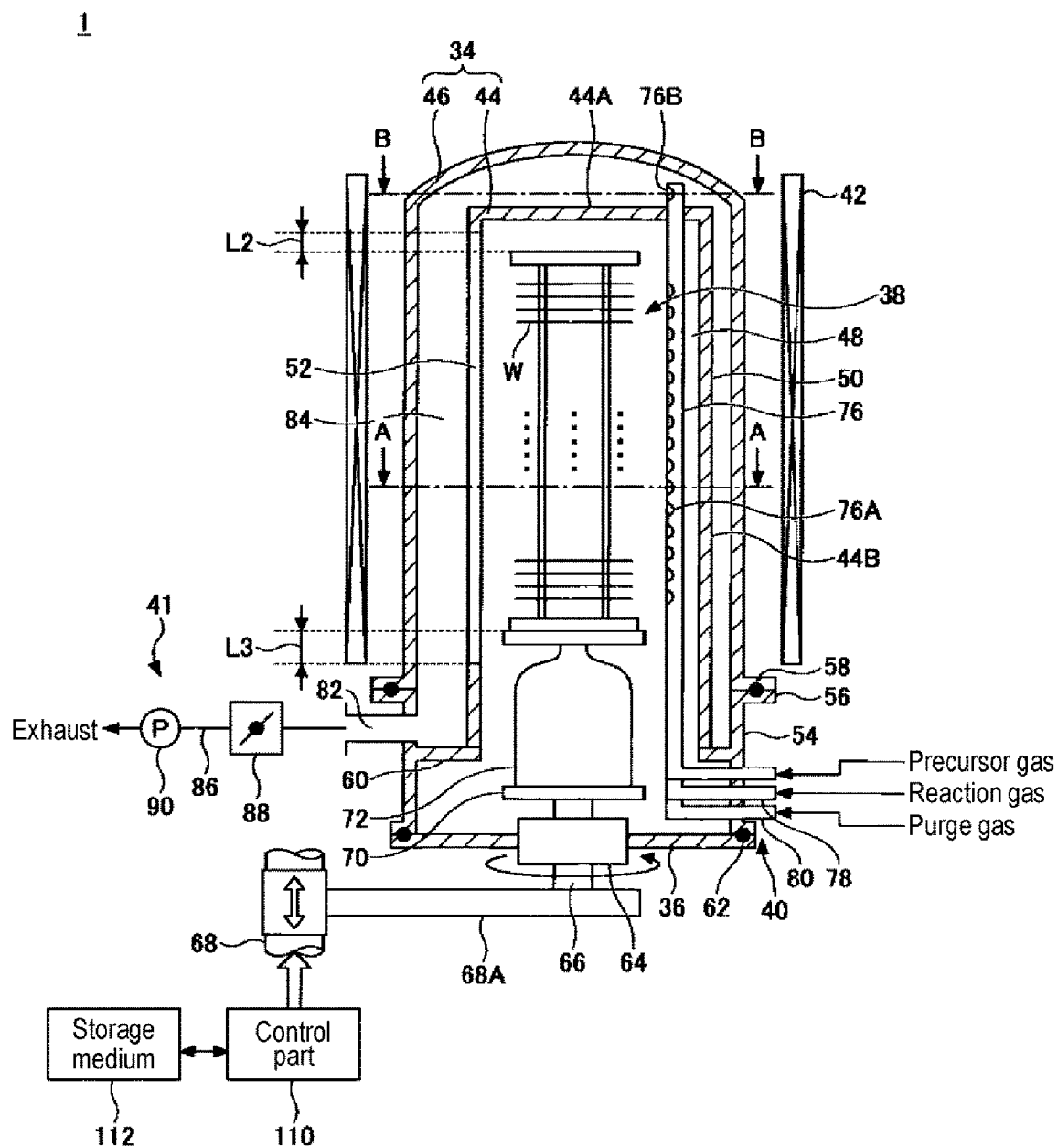
FIG. 1 is a cross-sectional view showing an example of a vertical heat treatment apparatus according to an embodiment of the present disclosure.

Reference now will be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes for carrying out the present disclosure will be described with reference to the drawings. Throughout the specification and the drawings, the same or similar parts and portions are denoted by the same reference numerals, and explanation thereof will not be repeated.

[Vertical Heat Treatment Apparatus]

Figure 2:
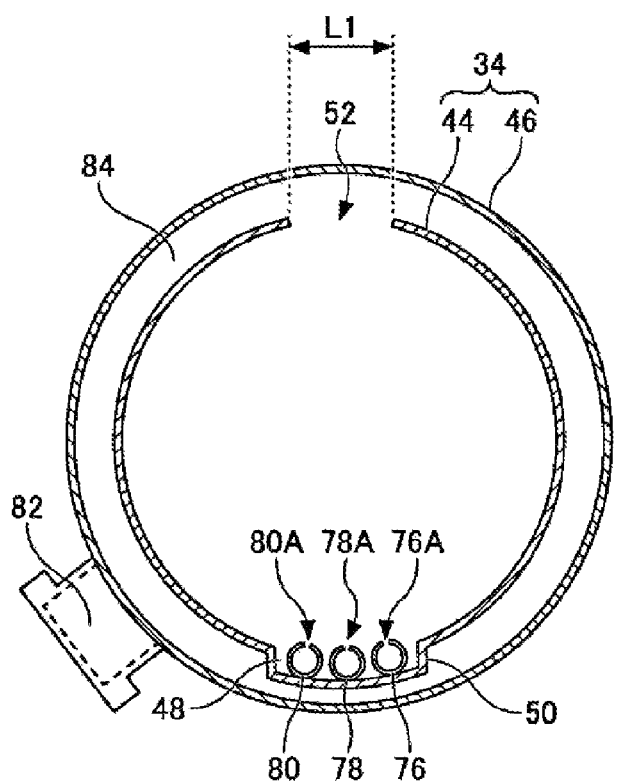
FIG. 2 is a cross-sectional view taken along one-dot chain line A-A in FIG. 1.

A vertical heat treatment apparatus according to an embodiment of the present disclosure will now be described. FIG. 1 is a cross-sectional view showing an example of a vertical heat treatment apparatus according to an embodiment of the present disclosure. FIG. 2 is a cross-sectional view taken along one-dot chain line A-A in FIG. 1.

As illustrated in FIG. 1, the vertical heat treatment apparatus 1 includes a processing container 34, a lid 36, a substrate holder 38, a gas supply 40, an exhaust part 41 and a heater 42.

The processing container 34 accommodates a semiconductor wafer (hereinafter referred to as a "wafer W") as a substrate. The processing container 34 has a double tube structure including a cylindrical inner tube 44 having a ceiling, with its lower end opened, and a cylindrical outer tube 46 having a ceiling covering the outer side of the inner tube 44, with its lower end opened, and the inner tube 44 and the outer tube 46 are coaxially arranged. The inner tube 44 and the outer tube 46 are made of a heat resistant material such as quartz or silicon carbide (SiC).

A ceiling 44A of the inner tube 44 is formed, for example, flat. On one side of the inner tube 44, a nozzle accommodating portion 48 is formed for accommodating gas nozzles 76, 78 and 80 along the longitudinal direction (vertical direction) of the inner tube 44. In an embodiment of the present disclosure, as illustrated in FIG. 2, a portion of the side wall 44B of the inner tube 44 is protruded outward to form a convex portion 50, and the inner space of the convex portion 50 serves as the nozzle accommodating portion 48. On a side of the side wall 44B of the inner tube 44 that is opposite to the nozzle accommodating portion 48, a rectangular slit 52 having a width L1 is formed along the longitudinal direction (vertical direction) of the side wall 44B. The width L1 of the slit 52 is set to fall within a range of 10 mm to 400 mm.

The slit 52 is a gas exhaust port formed so as to be able to exhaust a gas inside the inner tube 44. The length of the slit 52 is the same as the length of the substrate holder 38 or is longer than the substrate holder 38 so as to extend in the vertical direction. That is, the upper end of the slit 52 extends to a position equal to or higher than the position corresponding to the upper end of the substrate holder 38, and the lower end of the slit 52 extends to a position equal to or lower than the position corresponding to the lower end of the substrate holder 38. Specifically, as illustrated in FIG. 1, the distance L2 in the height direction between the upper end of the substrate holder 38 and the upper end of the slit 52 is within a range of about 0 mm to 5 mm. The distance L3 in the height direction between the lower end of the substrate holder 38 and the lower end of the slit 52 is within a range of about 0 mm to 350 mm. The substrate holder 38 can be accommodated in the processing container 34 and holds a plurality of wafers W (for example, 150 wafers) in a substantially horizontal posture with a predetermined interval in the vertical direction.

The lower end of the processing container 34 is supported by a cylindrical manifold 54 that is made of, for example, stainless steel. A flange 56 is formed at the upper end of the manifold 54. The outer tube 46 is supported by installing the lower end of the outer tube 46 on the flange 56. A seal member 58 such as an O-ring is installed between the flange 56 and the lower end of the outer tube 46. The interior of the outer tube 46 is maintained in an airtight state by the seal member 58.

An annular support 60 is installed on the inner wall of the upper portion of the manifold 54. The inner tube 44 is supported by installing the lower end of the inner tube 44 on the support 60. The lid 36 is air-tightly installed to the opening at the lower end of the manifold 54 via a seal member 62 such as an O-ring. The opening at the lower end of the processing container 34, that is, the opening of the manifold 54, is air-tightly closed by the lid 36. The lid 36 is made of, for example, stainless steel.

A rotary shaft 66 is installed at the center of the lid 36 so as to penetrate through a magnetic fluid seal 64. The lower portion of the rotary shaft 66 is rotatably supported by an arm 68A of an elevator 68 such as a boat elevator.

A rotating plate 70 is installed at the upper end of the rotary shaft 66, and the substrate holder 38 for holding the wafer W is placed on the rotating plate 70 via a heat insulating base 72 made of quartz. Therefore, by moving up and down the elevator 68, the lid 36 and the substrate holder 38 move vertically as a unit, and the substrate holder 38 can be inserted into and removed from the processing container 34.

The gas supply 40 is installed in the manifold 54 and supplies various gases such as a precursor gas, a reaction gas, a purge gas and the like into the inner tube 44. The gas supply 40 has a plurality of, for example 3, gas nozzles 76, 78 and 80 made of quartz. Each of the gas nozzles 76, 78 and 80 is installed inside the inner tube 44 along the longitudinal direction of the inner tube 44, and the proximal end (lower end) of the each of the gas nozzles 76, 78 and 80 is bent in an L-shape and supported so as to penetrate the manifold 54. As illustrated in FIG. 2, the gas nozzles 76, 78 and 80 are arranged in a row along the circumferential direction within the nozzle accommodating portion 48 of the inner tube 44.

The gas nozzle 76 supplies a precursor gas into the processing container 34. On the gas nozzle 76, gas holes 76A, which are a plurality of first gas holes, are formed at a predetermined interval along the longitudinal direction of the gas nozzle 76. The gas holes 76A are formed at the inside of the inner tube 44 and discharge a precursor gas into the inner tube 44 in the horizontal direction. The predetermined interval is set to, for example, the same as the interval of the wafers W supported by the substrate holder 38. In addition, the positions of the gas holes 76A in the height direction are set such that the gas holes 76A are positioned in the middle between the wafers W that are adjacent in the vertical direction so that the precursor gas can be efficiently supplied between the wafers W. In addition, the distal end (upper end) of the gas nozzle 76 penetrates from the inside of the inner tube 44 to the outside of the inner tube 44 at the ceiling 44A. As illustrated in FIG. 1, a gas hole 76B, which is a second gas hole, is formed at the distal end of the gas nozzle 76. The gas hole 76B is formed at the outside of the inner tube 44 and discharges the precursor gas to the outside of the inner tube 44. For the precursor gas, for example, a silicon-containing gas or a metal-containing gas can be used. Examples of the silicon-containing gas may include dichlorosilane (DCS: $SiH_2Cl_2$), hexachlorodisilane (HCD: $Si_2Cl_6$), tetrachlornsilane ($SiCl_4$), trichlorosilane ($SiHCl_3$) and the like. Examples of the metal-containing gas may include titanium tetrachloride ($TiCl_4$), trimethylaluminum (TMA), tetrakis(dimethylamino)hafnium ($Hf[N(CH_3)_2]_4$(TDMAH)), tetrakis(N-ethylmethylamino)zirconium (TEMAZ), tri(dimethylamino)cyclopentadienylzirconium ($C_5H_5$)$Zr[N(CH_3)_2]_3$. The details of the gas nozzle 76 will be described later.

The gas nozzle 78 supplies a reaction gas that reacts with the precursor gas into the processing container 34. A plurality of gas holes 78A are formed in the gas nozzle 78 at a predetermined interval along the longitudinal direction of the gas nozzle 78. The gas holes 78A are formed at the inside of the inner tube 44 and discharge the reaction gas into the inner tube 44 in the horizontal direction. The predetermined interval is set to, for example, the same as the interval of the wafers W supported by the substrate holder 38. In addition, the positions of the gas holes 78A in the height direction are set such that the gas holes 78A are positioned in the middle between the wafers W adjacent in the vertical direction so that the reaction gas can be efficiently supplied between the wafers W. For the reaction gas, for example, a nitriding gas or an oxidizing gas can be used. Examples of the nitriding gas may include ammonia ($NH_3$), an organic amine gas, diazene ($N_2H_2$), hydrazine ($N_2H_4$), a hydrazine compound (e.g., monomethylhydrazine (MMH)) and the like. Examples of the oxidizing gas may include ozone ($O_3$), oxygen ($O_2$), vapor ($H_2O$), hydrogen+oxygen ($H_2+O_2$), hydrogen+ozone ($H_2+O_3$), nitrogen monoxide (NO), nitrous oxide ($N_2O$), nitrogen dioxide ($NO_2$), carbon monoxide (CO), carbon dioxide ($CO_2$) and the like.

The gas nozzle 80 supplies a purge gas into the processing container 34. A plurality of gas holes 80A are formed in the gas nozzle 80 at a predetermined interval along the longitudinal direction of the gas nozzle 80. The gas holes 80A are formed at the inside of the inner tube 44 and discharge the purge gas into the inner tube 44 in the horizontal direction. The predetermined interval is set to, for example, the same as the interval of the wafers W supported by the substrate holder 38. In addition, the positions of the gas holes 80A in the height direction are set such that the gas holes 80A are positioned in the middle between the wafers W adjacent in the vertical direction so that the purge gas can be efficiently supplied between the wafers W. For the purge gas, for example, nitrogen ($N_2$) gas or argon (Ar) gas can be used.

In addition, an exhaust port 82 is formed in the side wall of the upper portion of the manifold 54 and above the support 60. The exhaust port 82 is configured to communicate with the space 84 between the inner tube 44 and the outer tube 46. An internal gas of the inner tube 44 discharged from the slit 52 via the space 84 and a gas discharged from the gas hole 76B of the gas nozzle 76 to the space 84 are exhausted to the outside of the processing container 34 via the exhaust port 82. The exhaust part 41 for exhausting the gas in the processing container 34 is installed at the exhaust port 82. The exhaust part 41 has an exhaust passage 86 connected to the exhaust port 82, and a pressure regulating valve 88 and a vacuum pump 90 are sequentially disposed on the exhaust passage 86 to evacuate the interior of the processing container 34.

The cylindrical heater 42 is installed on the outer peripheral side of the outer tube 46 so as to cover the outer tube 46. The heater 42 heals the wafers W accommodated in the processing container 34.

The operation of each part of the vertical heat treatment apparatus 1 configured as described above is controlled by a controller 110 such as a computer or the like. Further, a program of the computer that performs the operation of the each part of the vertical heat treatment apparatus 1 is stored in a storage medium 112. The storage medium 112 may be, for example, a flexible disk, a compact disk, a hard disk, a flash memory, a DVD or the like.

[Gas Nozzle]

Next, the configuration of the gas nozzles 76, 78 and 80 used in the above-described vertical heat treatment apparatus 1 will be described with the gas nozzle 76 as an example. However, the gas nozzle 78 and the gas nozzle 80 may have the same configuration as the gas nozzle 76. For example, for the gas nozzle 78 for supplying the reaction gas, by adopting the same configuration as the gas nozzle 76 for supplying the precursor gas, a film having the same composition as the film formed on the inner surface of the inner tube 44 is formed on the outer surface of the inner tube 44 or the inner surface of the outer tube 46 during a film forming process. Therefore, it is possible to prevent a film from residing on the outer surface of the inner tube 44 or the inner surface of the outer tube 46 during dry cleaning in the processing container 34. In addition, since a difference in stress between the film formed on the outer surface of the inner tube 44 or the inner surface of the outer tube 46 and the film formed on the inner surface of the inner tube 44 becomes small, it is possible to prevent a film from being peeled off.

(First Configuration Example)

Figure 3:
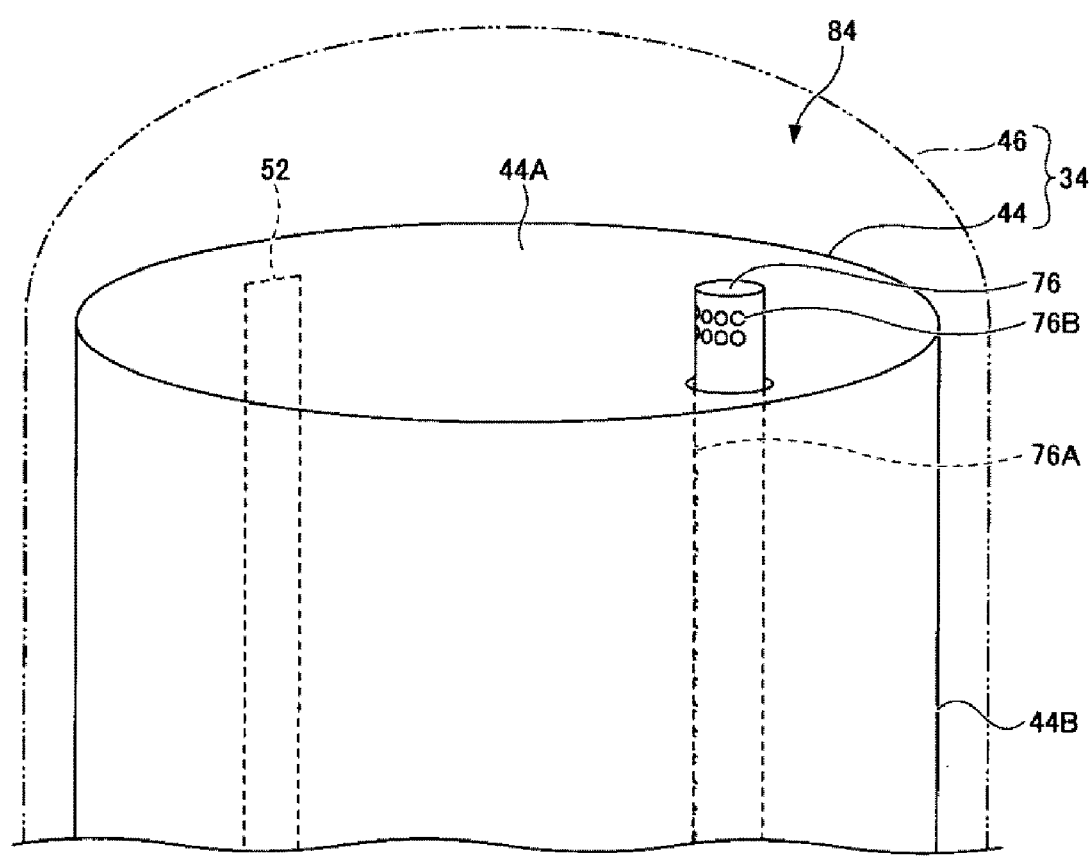
FIG. 3 is a perspective view showing a first configuration example of a gas nozzle of the vertical heat treatment apparatus of FIG. 1.
Figure 4:
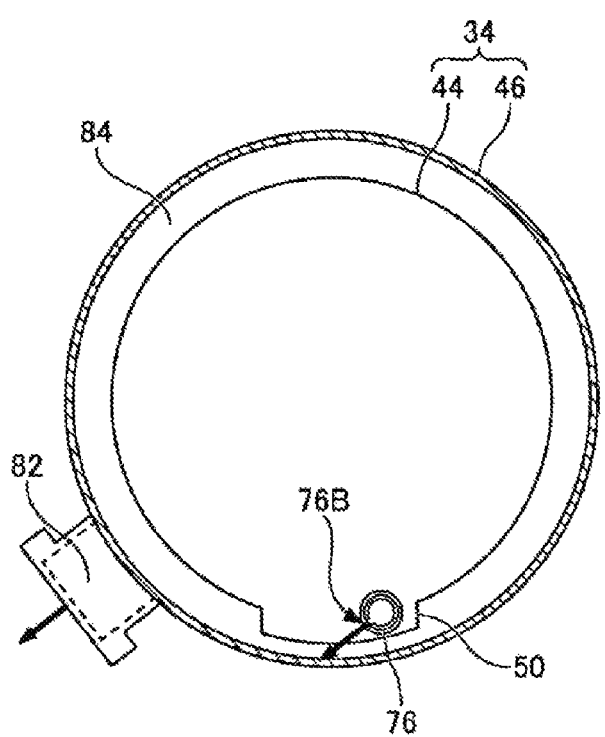
FIG. 4 is a cross-sectional view taken along one-dot chain line B-B in FIG. 1.

FIG. 3 is a perspective view showing a first configuration example of the gas nozzle 76 of the vertical heat treatment apparatus 1 of FIG. 1. FIG. 4 is a cross-sectional view taken along one-dot chain line B-B in FIG. 1. The gas nozzle 78 and the gas nozzle 80 are omitted in FIG. 3.

As illustrated in FIG. 3, the gas nozzle 76 of the first configuration example extends vertically along the inner peripheral surface of the inner tube 44, and the distal end of the gas nozzle 76 penetrates from the inside of the inner tube 44 to the outside of the inner tube 44 at the ceiling 44A of the inner tube 44. A plurality of gas holes 76A and a plurality of gas holes 76B are formed on the gas nozzle 76.

Each of the gas holes 76A is formed at the inside of the inner tube 44 and discharges a precursor gas into the inner tube 44 in the horizontal direction. Each of the gas holes 76A is formed on the tube wall of the gas nozzle 76 in a side facing the slit 52.

Each of the gas holes 76B is formed at the outside of the inner tube 44 and discharges the precursor gas into the space 84 outside the inner tube 44. As illustrated in FIG. 4, for example, each of the gas holes 76B is formed on the tube wall of the gas nozzle 76 in the side of the exhaust port 82. The opening area of the each of the gas holes 76B is formed so as to be larger than, for example, the opening area of the each of the gas holes 76A.

Although the plurality of gas holes 76B has been described in the example of FIG. 3, the number of the gas holes 76B may be one or more without being particularly limited.

(Second Configuration Example)

Figure 5:
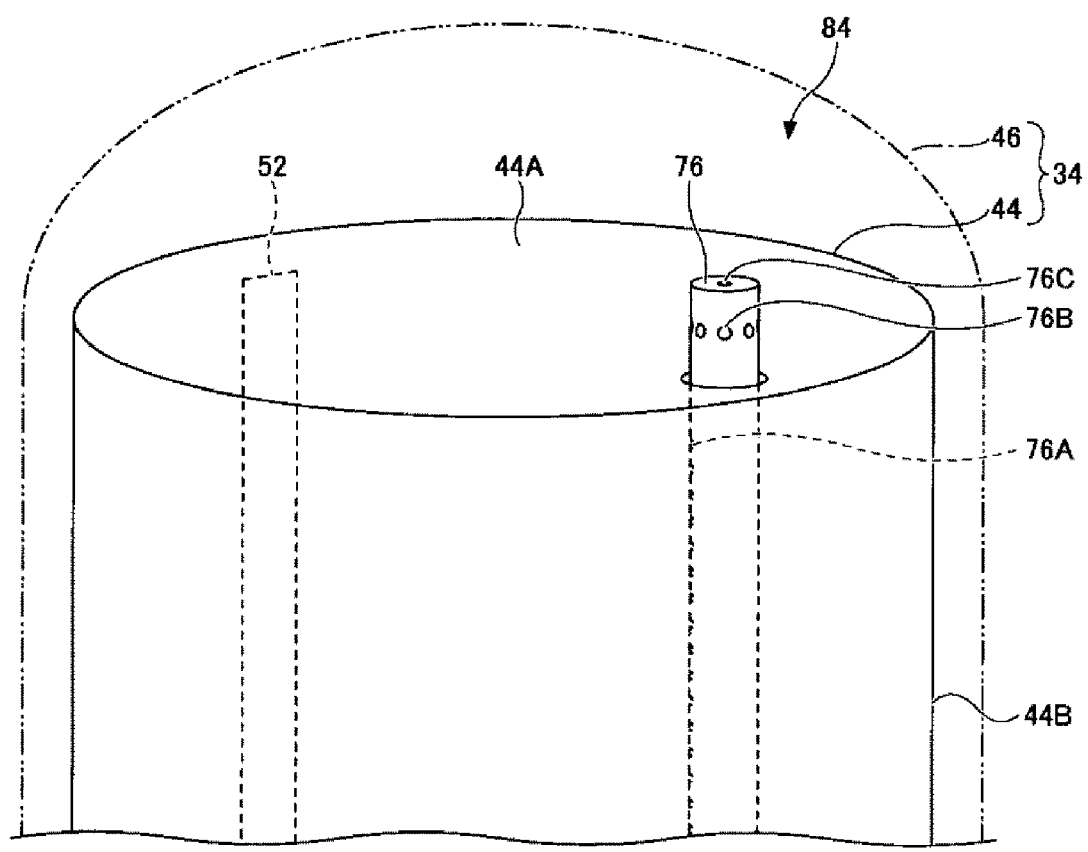
FIG. 5 is a perspective view showing a second configuration example of the gas nozzle of the vertical heat treatment apparatus of FIG. 1.

FIG. 5 is a perspective view showing a second configuration example of the gas nozzle 76 of the vertical heat treatment apparatus 1 of FIG. 1. The gas nozzle 78 and the gas nozzle 80 are omitted in FIG. 5.

As illustrated in FIG. 5, the gas nozzle 76 of the second configuration example extends vertically along the inner peripheral surface of the inner tube 44, and the distal end of the gas nozzle 76 penetrates from the inside of the inner tube 44 to the outside of the inner tube 44 at the ceiling 44A of the inner tube 44. A plurality of gas holes 76A, a plurality of gas holes 76B and one gas hole 76C are formed on the gas nozzle 76.

Each of the gas holes 76A is formed at the inside of the inner tube 44 and discharges a precursor gas into the inner tube 44 in the horizontal direction. Each of the gas holes 76A is formed on the tube wall of the gas nozzle 76 in a side facing the slit 52.

Each of the gas holes 76B is formed at the outside of the inner tube 44 and discharges the precursor gas into the space 84 outside the inner tube 44. The gas holes 76B are formed at a predetermined interval along the circumferential direction of the tube wall of the gas nozzle 76. The opening area of the each of the gas holes 76B is formed so as to be larger than, for example, the opening area of the each of the gas holes 76A.

The gas hole 76C is formed on the upper end surface of the gas nozzle 76 and discharges the precursor gas into the space 84 outside the inner tube 44. The opening area of the gas hole 76C is formed so as to be larger than, for example, the opening area of the each of the gas holes 76A.

Although the plurality of gas holes 76B has been described in the example of FIG. 5, the number of the gas holes 76B may be one or more without being particularly limited. In addition, although the one gas hole 76C has been described in the example of FIG. 5, the number of the gas holes 76C may be two or more.

(Third Configuration Example)

Figure 6:
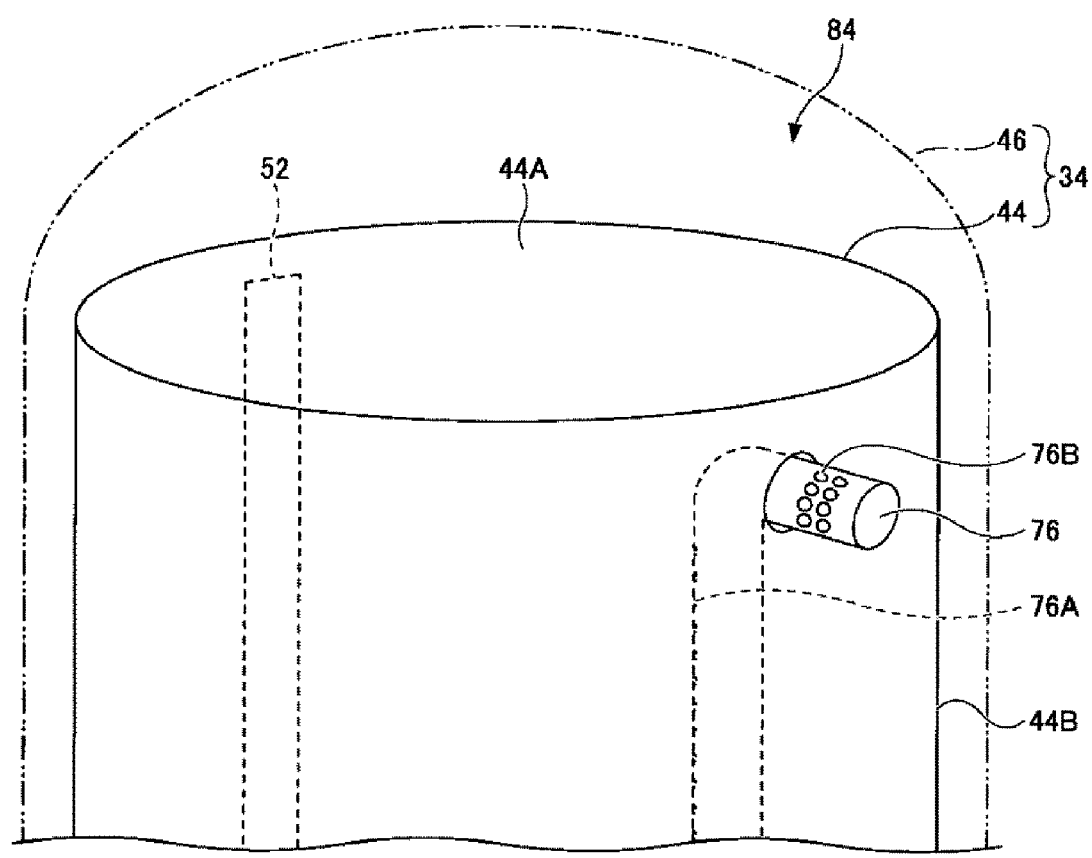
FIG. 6 is a perspective view showing a third configuration example of the gas nozzle of the vertical heat treatment apparatus of FIG. 1.

FIG. 6 is a perspective view showing a third configuration example of the gas nozzle 76 of the vertical heat treatment apparatus 1 of FIG. 1. The gas nozzle 78 and the gas nozzle 80 are omitted in FIG. 6.

As illustrated in FIG. 6, the gas nozzle 76 of the third configuration example extends vertically along the inner peripheral surface of the inner tube 44, and the distal end of the gas nozzle 76 is bent in an L-shape and penetrates from the inside of the inner tube 44 to the outside of the inner tube 44 at the side wall 44B of the inner tube 44. A plurality of gas holes 76A and a plurality of gas holes 76B are formed on the gas nozzle 76.

Each of the gas holes 76A is formed at the inside of the inner tube 44 and discharges a precursor gas into the inner tube 44 in the horizontal direction. Each of the gas holes 76A is formed on the tube wall of the gas nozzle 76 in a side facing the slit 52.

Each of the gas holes 76B is formed at the outside of the inner tube 44 and discharges the precursor gas into the space 84 outside the inner tube 44. Each of the gas holes 76B is formed on the tube wall of the gas nozzle 76 in a side of the exhaust port 82. The opening area of the each of the gas holes 76B is formed so as to be larger than, for example, the opening area of the each of the gas holes 76A.

Although the plurality of gas holes 76B has been described in the example of FIG. 6, the number of the gas holes 76B may be one or more without being particularly limited.

(Fourth Configuration Example)

Figure 7:
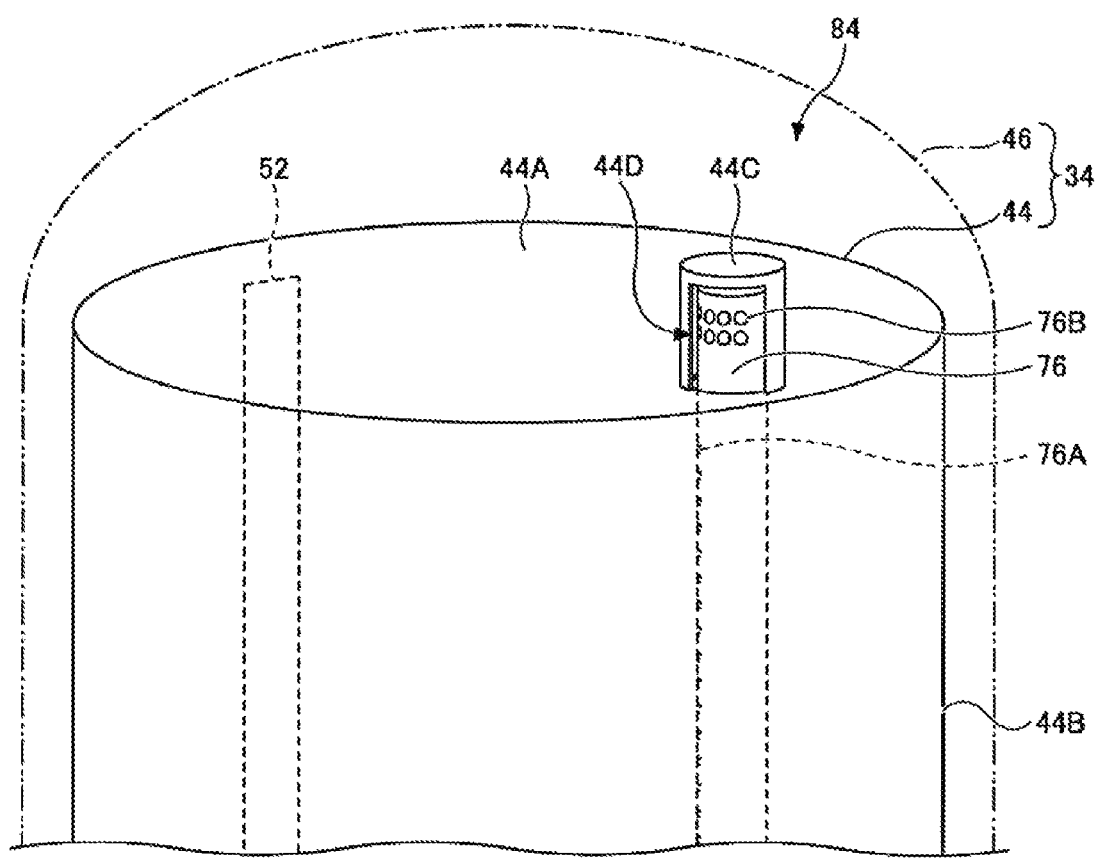
FIG. 7 is a perspective view showing a fourth configuration example of the gas nozzle of the vertical heat treatment apparatus of FIG. 1.

FIG. 7 is a perspective view showing a fourth configuration example of the gas nozzle 76 of the vertical heat treatment apparatus 1 of FIG. 1. The gas nozzle 78 and the gas nozzle 80 are omitted in FIG. 7.

As illustrated in FIG. 7, the gas nozzle 76 of the fourth configuration example extends vertically along the inner peripheral surface of the inner tube 44, and the distal end of the gas nozzle 76 penetrates from the inside of the inner tube 44 to the outside of the inner tube 44 at the ceiling 44A of the inner tube 44. A plurality of gas holes 76A and a plurality of gas holes 76B are formed on the gas nozzle 76.

Each of the gas holes 76A is formed at the inside of the inner tube 44 and discharges a precursor gas into the inner tube 44 in the horizontal direction. Each of the gas holes 76A is formed on the tube wall of the gas nozzle 76 in a side facing the slit 52.

Each of the gas holes 76B is formed at the outside of the inner tube 44 and discharges the precursor gas into the space 84 outside the inner tube 44. Each of the gas holes 76B is formed on the tube wall of the gas nozzle 76 in a side of the exhaust port 82. The opening area of the each of the gas holes 76B is formed so as to be larger than, for example, the opening area of the each of the gas holes 76A.

Further, as illustrated in FIG. 7, the distal end of the gas nozzle 76 is covered with a protective portion 44C formed by processing the inner tube 44. An opening 44D is formed in a region of the protective portion 44C corresponding to the gas hole 76B, and a gas discharged from the gas hole 76B is supplied from the opening 44D of the protective portion 44C into the space 84 outside the inner tube 44.

Although the plurality of gas holes 76B has been described in the example of FIG. 7, the number of the gas holes 76B may be one or more without being particularly limited.

Although the gas nozzles 76 of the first to fourth configuration examples have been described above, the shape of the gas nozzles 76 is not limited to the first to fourth configuration examples.

For example, the gas hole 76B may be formed at a position different from the side of the exhaust port 82 on the tube wall of the gas nozzle 76. However, the gas hole 76B may be formed in the side of the exhaust port 82 outside the inner tube 44. When the gas hole 76B is formed in the side of the exhaust port 82 outside the inner tube 44, an HCD gas discharged from the gas hole 76B forms a flow toward the exhaust port 82. As a result, since the HCD gas which is discharged from the gas hole 76A into the inner tube 44 and reaches the exhaust port 82 via the slit 52 is discharged to the exhaust port 82 on the flow toward the exhaust port 82, it is possible to prevent the HCD gas from back flowing from the outside of the inner tube 44 to the inside of the inner tube 44.

Further, for example, the opening area of the each of the gas holes 76B may be formed to be smaller than the opening area of the each of the gas holes 76A, or may be the same as the opening area of the each of the gas holes 76A. However, the opening area of the gas hole 76B per unit length of a gas nozzle may be formed to be larger than the opening area of the gas hole 76A per unit length of a gas nozzle. For example, when the opening area of the each of the gas holes 76B is smaller than the opening area of the each of the gas hole 76A or when the opening area of the each of the gas hole 76B is the same as the opening area of the each of the gas hole 76A, the number of the gas holes 76B per unit length of a gas nozzle may be set to be larger than the number of the gas holes 76A per unit length of a gas nozzle. The unit length of a gas nozzle can be, for example, the length of a portion of the gas nozzle 76 protruding to the outside of the inner tube 44. The length of the portion of the gas nozzle 76 protruding to the outside of the inner tube 44 may be any length as long as the gas nozzle 76 does not contact the outer tube 46, and may be, for example, 20 mm to 50 mm. In this manner, since the opening area of the gas hole 76B per unit length of a gas nozzle is formed to be larger than the opening area of the gas hole 76A per unit length of a gas nozzle, the internal gas pressure of the gas nozzle 76 can be efficiently reduced. Therefore, the HCD gas hardly stays in the gas nozzle 76. As a result, since the time for which the HCD gas is exposed to the high temperature atmosphere in the processing container 34 is shortened, the thermal decomposition of the HCD gas in the gas nozzle 76 is suppressed and the amount of decomposed matter attached to the inner wall of the gas nozzle 76 is reduced.

[Film Forming Method]

Next, a film forming method using the vertical heat treatment apparatus 1 according to the embodiment of the present disclosure will be described with an example of forming a silicon nitride film on a wafer W by an atomic layer deposition (ALD) method. In the following description, the operation of the each part of the vertical heat treatment apparatus 1 is controlled by the controller 110.

Figure 8:
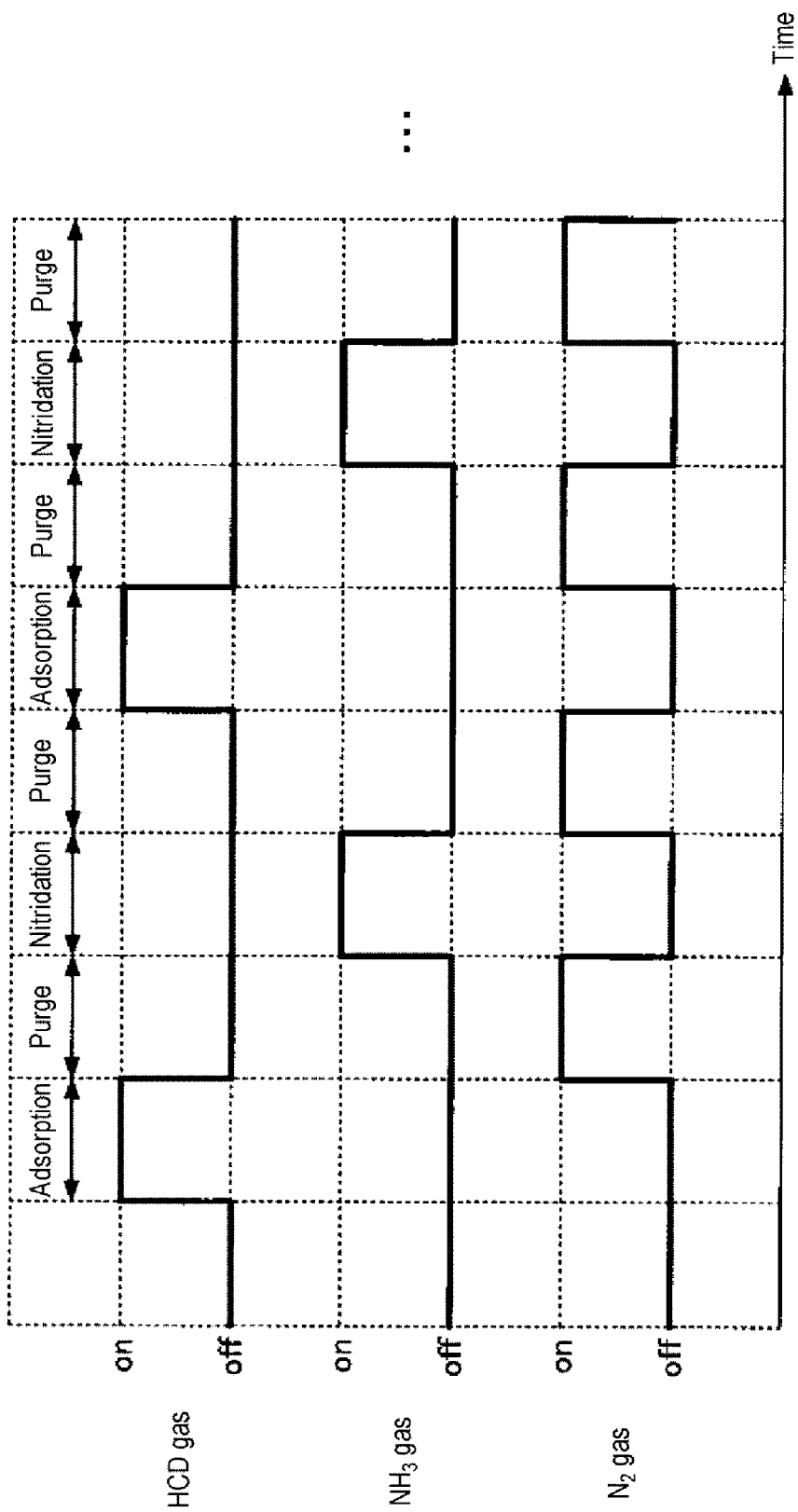
FIG. 8 is a time chart showing an example of a method of forming a silicon nitride film.

FIG. 8 is a time chart showing an example of a method of forming a silicon nitride film. As illustrated in FIG. 8, the silicon nitride film forming method repeats an adsorption step, a purge step, a nitridation step and a purge step in this order for a plurality of cycles, thereby forming a silicon nitride film having a desired film thickness on the wafer W. The adsorption step is a step of adsorbing a precursor gas on the wafer W. The purge step is a step of purging the interior of the processing container 34. The nitridation step is a step of nitriding the precursor gas adsorbed on the wafer W.

First, the interior of the processing container 34 is maintained at a predetermined temperature by the heater 42. Subsequently, the substrate holder 38 holding the wafer W is placed on the lid 36, and the lid 36 is raised by the elevator 68 to load the wafer W (substrate holder 38) into the processing container 34.

Subsequently, the adsorption step of adsorbing an HCD gas as a precursor gas on the wafer W is executed. Specifically, the interior of the processing container 34 is set to a predetermined temperature by the heater 42. While supplying a predetermined flow rate of $N_2$ gas from the gas nozzle 80 into the processing container 34, the processing container 34 is set at a predetermined pressure by discharging the internal gas of the processing container 34. After the internal temperature and internal pressure of the processing container 34 are stabilized, the HCD gas is discharged from the gas hole 76A into the inner tube 44 and is discharged from the gas hole 76B to the outside of the inner tube 44. The HCD gas discharged into the inner tube 44 is heated and thermally decomposed inside the inner tube 44, and silicon (Si) generated by the thermal decomposition is adsorbed on the wafer W. The HCD gas supplied to the outside of the inner tube 44 is discharged from the exhaust port 82 through the space 84 between the inner tube 44 and the outer tube 46. After lapse of a predetermined time, the supply of HCD gas from the gas nozzle 76 (the gas holes 76A and 76B) is stopped.

In this operation, in the gas nozzle 76, the gas hole 76B for discharging the HCD gas to the outside of the inner tube 44 is formed separately from the gas hole 76A for discharging the HCD gas into the inner tube 44. Since the gas hole 76B is formed on the gas nozzle 76, the internal gas pressure of the gas nozzle 76 is lower than that in a case where the gas hole 76B is not formed, which makes it hard for the HCD gas to stay in the gas nozzle 76. As a result, since the time for which the HCD gas is exposed to the high temperature atmosphere in the processing container 34 is shortened, the thermal decomposition of the HCD gas in the gas nozzle 76 is suppressed and the amount of decomposed matter adhered to the inner wall of the gas nozzle 76 is reduced.

In addition, since the HCD gas discharged from the gas hole 76B is not supplied into the inner tube 44, the bias of the gas flow inside the inner tube 44 can be reduced. As a result, the inter-plane uniformity is improved.

Further, since the gas hole 76B is formed in the side of the exhaust port 82 outside the inner tube 44, the HCD gas discharged from the gas hole 76B forms a flow toward the exhaust port 82. As a result, since the HCD gas which is discharged from the gas hole 76A into the inner tube 44 and reaches the exhaust port 82 via the slit 52 is discharged to the exhaust port 82 on the flow toward the exhaust port 82, it is possible to prevent the HCD gas from back flowing from the outside of the inner tube 44 to the inside of the inner tube 44.

Subsequently, the purge step of purging the interior of the inner tube 44 is executed. Specifically, while supplying a predetermined flow rate of $N_2$ gas from the gas nozzle 80 into the inner tube 44, the internal gas of the inner tube 44 is discharged and the HCD gas in the inner tube 44 is replaced with the $N_2$ gas. After lapse of a predetermined time, the supply of the $N_2$ gas from the gas nozzle 80 is stopped.

In this operation, the HCD gas discharged from the gas hole 76B in the adsorption step is discharged into the space 84 between the inner tube 44 and the outer tube 46 directly connected to the exhaust port 82 without being discharged into the inner tube 44, and is immediately discharged from the exhaust port 82. Therefore, in the purge step, since it is sufficient to purge only the HCD gas discharged into the inner tube 44, the time required for purging the interior of the inner tube 44 can be shortened.

Subsequently, the nitridation step of nitriding Si adsorbed on the wafer W in the adsorption step is executed. In the nitridation step, the interior of the processing container 34 is set to a predetermined temperature by the heater 42. While supplying a predetermined flow rate of $NH_3$ gas as a nitriding gas from the gas hole 78A of the gas nozzle 78 into the inner tube 44, the internal gas of the processing container 34 is discharged and the processing container 34 is set to a predetermined pressure. The $NH_3$ gas supplied into the inner tube 44 reacts with Si adsorbed on the wafer W so as to nitride the Si in the adsorption step. After lapse of a predetermined time, the supply of the $NH_3$ gas from the gas nozzle 78 is stopped.

Subsequently, the purge step of purging the interior of the inner tube 44 is executed. Specifically, while supplying a predetermined flow rate of N, gas from the gas nozzle 80 into the inner tube 44, the internal gas of the inner tube 44 is discharged and the $NH_3$ gas in the inner tube 44 is replaced with the $N_2$ gas. After lapse of a predetermined time, the supply of the $N_2$ gas from the gas nozzle 80 is stopped.

Thus, one cycle of the ALD method including the adsorption step, the purge step, the nitridation step and the purge step is completed. Subsequently, one cycle of the ALD method starting from the adsorption step is started again. By repeating this cycle a predetermined number of times (for example, 100 times), a silicon nitride film having a desired film thickness is formed on the wafer W.

When the silicon nitride film having a desired film thickness is formed on the wafer W, while maintaining the interior of the processing container 34 at a predetermined temperature by the heater 42, a predetermined flow rate of N, gas is supplied from the gas nozzle 80 into the processing container 34 to cyclically purge the interior of the processing container 34 with the $N_2$ gas so that the interior of the processing container 34 returns to the normal pressure. Subsequently, the lid 36 is lowered by the elevator 68 to unload the wafer W (substrate holder 38) from the processing container 34.

As described above, in the embodiment of the present disclosure, in the gas nozzle 76, the gas hole 76B for discharging the HCD gas to the outside of the inner tube 44 is formed separately from the gas hole 76A for discharging the HCD gas into the inner tube 44. Since the gas hole 76B is formed on the gas nozzle 76, the internal gas pressure of the gas nozzle 76 is lower than the internal gas pressure in a case where the gas hole 76B is not formed, which makes it hard for the HCD gas to stay in the gas nozzle 76. As a result, since the time for which the HCD gas is exposed to the high temperature atmosphere in the processing container 34 is shortened, the thermal decomposition of the HCD gas in the gas nozzle 76 is suppressed and the amount of decomposed matter adhered to the inner wall of the gas nozzle 76 is reduced.

In addition, since the HCD gas discharged from the gas hole 76B is not supplied into the inner tube 44, the bias of the gas flow inside the inner tube 44 can be reduced. As a result, the inter-plane uniformity is improved.

In addition, the HCD gas discharged from the gas hole 76B in the adsorption step is discharged into the space 84 between the inner tube 44 and the outer tube 46 directly connected to the exhaust port 82 without being discharged into the inner tube 44, and is immediately discharged from the exhaust port 82. Therefore, in the purge step, since it is sufficient to purge only the HCD gas discharged into the inner tube 44, the time required for purging the interior of the inner tube 44 can be shortened.

Further, since the gas hole 76B is formed in the side of the exhaust port 82 outside the inner tube 44, the HCD gas discharged from the gas hole 76B forms a flow toward the exhaust port 82. As a result, since the HCD gas which is discharged from the gas hole 76A into the inner tube 44 and reaches the exhaust port 82 via the slit 52 is discharged to the exhaust port 82 on the flow toward the exhaust port 82, it is possible to prevent the HCD gas from back flowing from the outside of the inner tube 44 to the inside of the inner tube 44.

EXAMPLES

Next, effects of supplying a precursor gas using the vertical heat treatment apparatus 1 according to the embodiment of the present disclosure will be described.

Figure 9A:
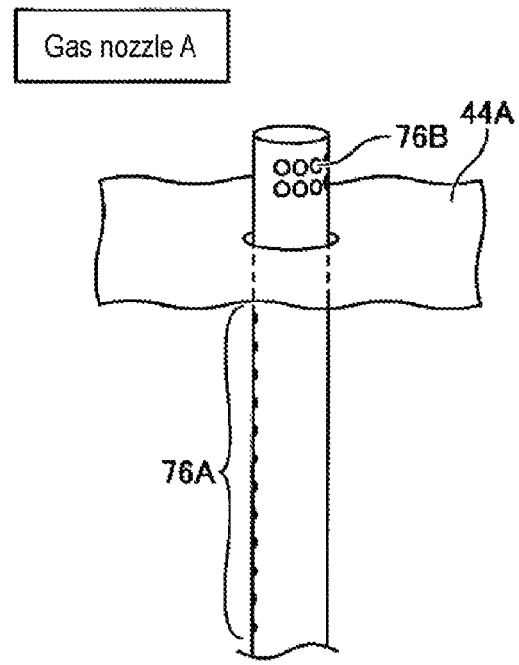
FIG. 9A is a figure for explaining a type of the gas nozzle used in Examples.
Figure 9B:
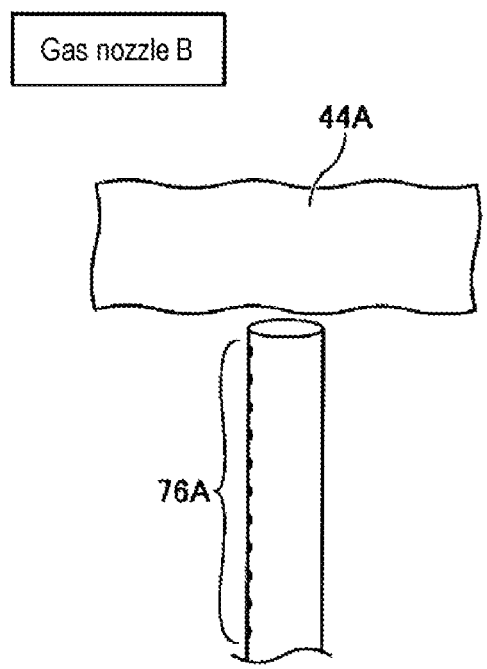
FIG. 9B is a figure for explaining another type of the gas nozzle used in the Examples.

First, types of a gas nozzle 76 used in the Examples will be described. FIGS. 9A, 9B and 9C are figures for explaining the types of a gas nozzle used in the Examples.

As illustrated in FIG. 9A, a gas nozzle A has its distal end penetrating from the inside of the inner tube 44 to the outside of the inner tube 44 at the ceiling 44A and is formed with the gas holes 76A for discharging a precursor gas into the inner tube 44 and the gas holes 76B for discharging the precursor gas to the outside of the inner tube 44.

As illustrated in FIG. 9B, a gas nozzle B has its distal end not penetrating the ceiling 44A and is formed with the gas holes 76A for discharging a precursor gas into the inner tube 44 and but not with the gas holes 76B for discharging the precursor gas to the outside of the inner tube 44.

As illustrated in FIG. 9C, a gas nozzle C is formed with the gas holes 76A, gas holes 76D and a gas hole 76E for discharging a precursor gas into the inner tube 44 and but not with the gas holes 76B for discharging the precursor gas to the outside of the inner tube 44.

Example 1

Figure 10:
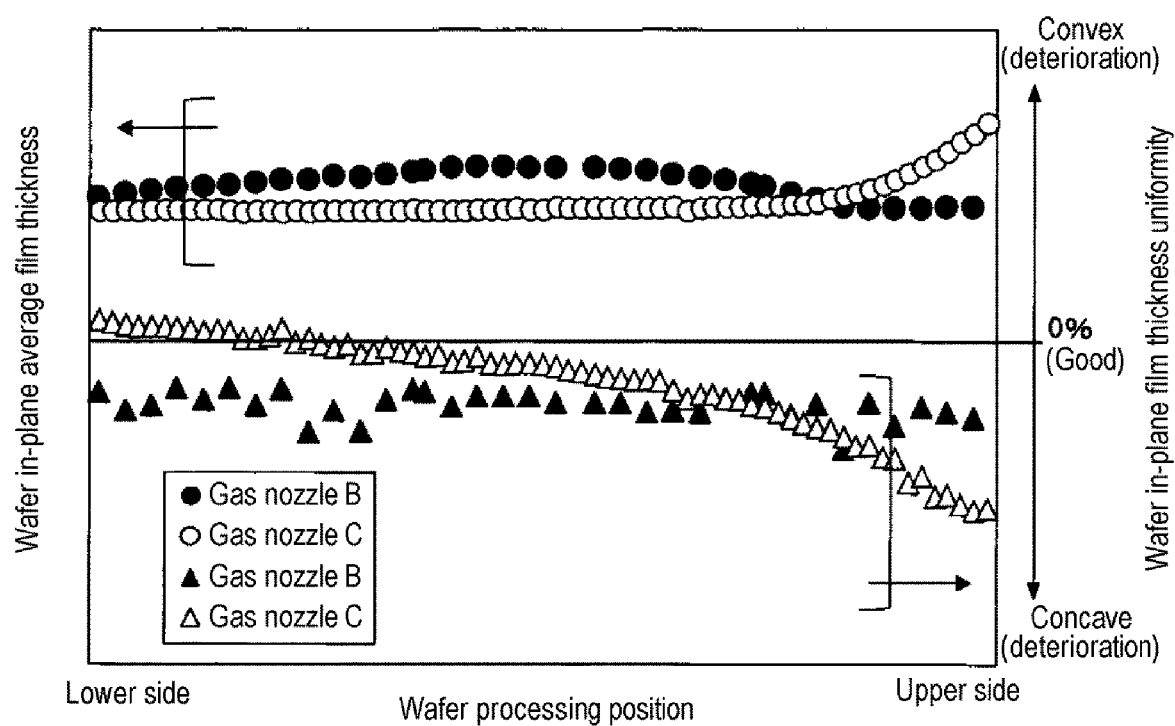
FIG. 10 is a figure that shows the relationship between a wafer processing position and a thickness of a film formed on a wafer.

In Example 1, a relationship between a position of a wafer W held by the substrate holder 38 when a silicon nitride film is formed on the wafer W using the gas nozzles B and C (hereinafter referred to as a "wafer processing position") and a film thickness of the silicon nitride film formed on the wafer W was evaluated. FIG. 10 is a figure that shows the relationship between the wafer processing position and the film thickness of the film formed on the wafer. In FIG. 10, the horizontal axis represents the wafer processing position, the left vertical axis (first axis) represents the in-plane average film thickness of the wafer W, and the right vertical axis (second axis) represents the in-plane film thickness uniformity of the wafer W.

In the second axis of FIG. 10, the median value indicates that the in-plane film thickness uniformity of the wafer W is the best (the in-plane distribution of the film thickness is 0%), and a value larger or smaller than the median value indicates that the in-plane film thickness uniformity of the wafer W deteriorates. More specifically, a value larger than the median value indicates that the film thickness at the central portion of the wafer W has a convex distribution having a thickness larger than the film thickness at the peripheral portion of the wafer W, and a value smaller than the median value indicates that the film thickness at the central portion of the wafer W has a concave distribution having a thickness smaller than the film thickness at the peripheral portion of the wafer W.

As illustrated in FIG. 10, in the case of using the gas nozzle B, it is found that the in-plane average film thickness and the in-plane uniformity of the silicon nitride film formed on the wafer W are substantially the same irrespective of the wafer processing position. On the other hand, in the case of using the gas nozzle C, it is found that the in-plane average film thickness of the silicon nitride film formed on the wafer W at the wafer processing position on the upper side becomes large and the in-plane distribution of the film thickness has a concave distribution, in which the in-plane uniformity is deteriorated.

Therefore, if the opening area of a gas hole is changed inside the inner tube 44, it is considered that the flow of the precursor gas is biased.

Example 2

In Example 2, the thicknesses of decomposed matter (products) adhered to the inner walls of the gas nozzles A, B and C when a silicon nitride film having a thickness of 3 μm was formed on the wafer W using the gas nozzles A, B and C were calculated by simulation. FIG. 11 is a figure that shows a result of simulation on decomposed matter adhered to the inner walls of the gas nozzles.

As illustrated in FIG. 11, when a silicon nitride film having a thickness of 3 μm is formed on the wafer W by using the gas nozzles A, B and C, the maximum values of the thicknesses of decomposed matter adhered to the inner walls of the gas nozzles A, B and C are 6.3 μm, 72 μm and 9.3 μm, respectively. That is, using the gas nozzle A can further reduce the amount of decomposed matter adhered to the inner wall of the gas nozzle, rather than using the gas nozzles B and C.

Example 3

In Example 3, the gas flow velocities at the respective gas holes when an HCD gas as a precursor gas was supplied into the processing container 34 using the gas nozzles A. B and C were calculated by simulation. FIG. 12 is a figure that shows a result of simulation on the relationship between a gas hole position and a gas flow velocity. In FIG. 12, the horizontal axis represents a gas hole position and the vertical axis represents a gas flow velocity (sccm). The simulation conditions are as follows.

<Simulation Conditions>
Temperature: 630 degrees C.
Flow rate of HCD gas: 300 sccm
Internal pressure of the inner tube 44: 133 Pa As illustrated in FIG. 12, in the case of using the gas nozzle B, a region where the gas flow velocity greatly changes inside the inner tube 44 is not observed. On the other hand, in the case of using the gas nozzle C, a region where the gas flow velocity is very large is observed on the upper portion of the inside of the inner tube 44. In the case of using the gas nozzle A, a region where the gas flow velocity is very large is observed outside the inner tube 44, but a region where the gas flow velocity greatly changes is not observed inside the inner tube 44.

Therefore, by using the gas nozzle A, it is possible to reduce the bias of the gas flow inside the inner tube 44.

Although the embodiment for carrying out the present disclosure has been described above, the description above do not limit the contents of the present disclosure, and various modifications and improvements are possible within the scope of the present disclosure.

In the above embodiments, the case where the substrate is a semiconductor wafer has been described by way of an example. However, the present disclosure is not limited thereto. For example, the substrate may be a glass substrate, an LCD substrate or the like.

According to the vertical heat treatment apparatus of the present disclosure, the amount of decomposed matter adhered to the inner wall of a gas nozzle is reduced while reducing the bias of a gas flow in a substrate processing region.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vertical heat treatment apparatus for forming a film by supplying a precursor gas to a plurality of substrates that are held in a substantially horizontal posture on a substrate holder with a predetermined interval in a vertical direction, the apparatus comprising:
   a processing container including, an inner tube accommodating the substrate holder and an outer tube that is disposed outside the inner tube; and
   a gas nozzle that extends vertically along an inner peripheral surface of the inner tube and has a distal end that penetrates from an inside of the inner tube to an outside of the inner tube,
   wherein a first gas hole for supplying the precursor gas to the inside of the inner tube and a second gas hole for supplying the precursor gas to the outside of the inner tube are formed on the gas nozzle;
   wherein the distal end of the gas nozzle penetrates from the inside of the inner tube to the outside of the inner tube at a ceiling of the inner tube.

2. The vertical heat treatment apparatus of claim 1, wherein the first gas hole is formed at the inside of the inner tube, and the second gas hole is formed at the outside of the inner tube.

3. The vertical heat treatment apparatus of claim 1, wherein an opening area of the second gas hole per unit length of the gas nozzle is larger than an opening area of the first gas hole per unit length of the gas nozzle.

4. The vertical heat treatment apparatus of claim 1, further comprising an exhaust port configured to communicate with a space between the inner tube and the outer tube,
   wherein the second gas hole is formed on a tube wall of the gas nozzle in a side of the exhaust port.

5. The vertical heat treatment apparatus of claim 1, wherein the precursor gas includes a silicon-containing gas or a metal-containing gas.

6. A vertical heat treatment apparatus for forming a film by supplying a processing gas to a plurality of substrates that are held in a substantially horizontal posture on a substrate holder with a predetermined interval in a vertical direction, the apparatus comprising:
   a processing container including an inner tube accommodating the substrate holder and an outer tube that is disposed outside the inner tube; and
   a plurality of gas nozzles, each of which extends vertically along an inner peripheral surface of the inner tube and has a distal end that penetrates from, an inside of the inner tube to an outside of the inner tube,
   wherein a first gas hole for supplying the processing gas to the inside of the inner tube and a second gas hole for supplying the processing gas to the outside of the inner tube are formed on the each of the plurality of gas nozzles;
   wherein the distal end of each gas nozzle penetrates from the inside of the inner tube to the outside of the inner tube at a ceiling of the inner tube.

7. The vertical heat treatment apparatus of claim 6, wherein the plurality of gas nozzles include a first gas nozzle for supplying a precursor gas and a second gas nozzle for supplying a reaction gas that reacts with the precursor gas.

8. The vertical heat treatment apparatus of claim 7, wherein the precursor gas includes a silicon-containing gas or a metal-containing gas, and the reaction gas includes a nitriding gas or an oxidizing gas.

* * * * *